United States Patent
Lin et al.

(10) Patent No.: US 6,930,349 B2
(45) Date of Patent: Aug. 16, 2005

(54) FLASH MEMORY

(75) Inventors: Elysia Lin, Taipei (TW); Shu-Cheng Chang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 2 days.

(21) Appl. No.: 10/604,882

(22) Filed: Aug. 25, 2003

(65) Prior Publication Data

US 2005/0082596 A1 Apr. 21, 2005

(30) Foreign Application Priority Data

Feb. 25, 2003 (TW) ........................................ 92103871 A

(51) Int. Cl.[7] ............................................. H01L 29/788
(52) U.S. Cl. ...................................... 257/315; 257/314
(58) Field of Search ................................. 257/314–320

(56) References Cited

U.S. PATENT DOCUMENTS 5,063,172 A * 11/1991 Manley ...................... 438/265
5,912,840 A * 6/1999 Gonzalez et al. ...... 365/185.05
6,171,909 B1 * 1/2001 Ding et al. ................. 438/267
6,200,856 B1 * 3/2001 Chen .......................... 438/257

* cited by examiner

Primary Examiner—Allan R. Wilson
(74) Attorney, Agent, or Firm—Jiang Chyun IP office

(57) ABSTRACT

A manufacturing method of a flash memory comprising forming a patterned first dielectric layer, forming a patterned first conductive layer and a patterned hard mask layer on a substrate. Next, forming a conformal second conductive layer on the substrate, and etching back the second conductive layer by using the hard mask layer as a etching stop layer to form a conductive spacer on both of the sidewalls of the first conductive layer. Thereafter, removing the hard mask layer, and forming a second dielectric layer and a third conductive layer on the substrate. Finally, a stacked gate structure is constructed by the third conductive layer, the second dielectric layer, the first conductive layer, the conductive spacer and the first dielectric layer, in which a floating gate of the stacked gate structure is constructed by a remainer portion of the first conductive layer and the conductive spacer. And a source/drain region is formed in both sides of the stacked gate structure.

4 Claims, 9 Drawing Sheets

FLASH MEMORY

CROSS REFERENCE TO RELATED APPLICATIONS

This application claims the priority benefit of Taiwan application serial no. 92103871, filed on Feb. 25, 2003.

BACKGROUND OF INVENTION

1. Field of the Invention

The present invention is generally related to a structure of a flash memory and a manufacturing method thereof. More particularly, the present invention relates to a structure of a flash memory having a conductive spacer in floating gate and a manufacturing method thereof.

2. Description of the Related Art

A memory device is a semiconductor device for storing data or information. In recent years, as the performance of the microprocessor of the computer has become more and more better, and the volume of software program execution and operation requires to be correspondingly huge, and the storage capacity requirement of the memory device also needs to be correspondingly increased. In order to manufacture a high density and low-cost memory device with a view to satisfy the requirement of the continual development of computers, the development of the manufacturing technology and process of memory device has become a driving force for developing a highly integrated semiconductor device.

For example, a flash memory device has become a widely preferred non-volatile memory device in a personal computer and electronic device because flash memory can be repeatedly used for saving, reading and erasing data, and the data stored in the memory can also be preserved even when the electrical power is cut off.

In a typical flash memory device, the floating gate and the control gate are formed using a doped polysilicon. Moreover, an inter-poly dielectric is disposed between the floating gate and the control gate, and a tunnel oxide layer is disposed between the floating gate and the substrate. To subject a flash memory to data write/erase operation, usually a bias is applied between the control gate and the source/drain region to inject electrons into the floating gate or to pull out electrons from the floating gate. To read out data from the flash memory, an operation voltage is applied to the control gate. The charged state of the floating gate will effect the on/off states of the channel, and the level 0 and 1 of the data read from the flash memory is dependent on the on/off states of the channel.

Referring FIGS. 1 and 2, FIG. 1 is a top view illustrating a conventional flash memory, and FIG. 2 is a cross-sectional view taken along the line A–A' of the flash memory of FIG. 1. The flash memory includes a substrate 100, a tunnel oxide layer 104, a floating gate 106, an inter-poly dielectric 108 and a control gate 110. A plurality of shallow trench isolation ("STI") layer 102 is formed in the substrate 100 to isolate each memory cell. The floating gate 106 has a shape similar to a rectangular block, and forms on the tunnel oxide layer 104 disposed on the substrate 100. The control gate 110 has a shape similar to a bar, and the alignment of the control gate 110 is perpendicular to the STI layer 102 to isolate the inter-poly dielectric 108 disposed on the floating gate 106 and the substrate 100. After the floating gate 106 and the control gate 110 is formed, the substrate 100 is doped to form a source region 112 and a drain region 114.

However, in the marked (circled) region 116 of FIG. 1 and FIG. 2, the contour of the floating gate 106 is similar to a right angle since the shape of the floating gate 106 is similar to a rectangular block in the above flash memory. Therefore, when the flash memory is operated and the applied voltage on the control gate 110 is increased, the charge stored in the floating gate 106 may penetrate into the control gate 110 from the marked (circled) region 116 through the inter-poly dielectric 108, and then the stored data is leaked out. In addition, during the etching process of the floating gate, if the etching condition is not well controlled, an undercut may occur in the side walls of the floating gate, shape of the corners of the floating gate more sharp, and thereby allowing the penetration of the charge of the stored data much more easier.

SUMMARY OF INVENTION

Accordingly, one object of the present invention is to provide a structure and a manufacturing method of a flash memory which is suitable for preventing a data leakage caused by the penetration of charge stored in the floating gate in order to enhance the data storage capacity.

It is another object of the present invention to provide a structure and a manufacturing method of a flash memory which is suitable for enlarging the area between the floating gate and the control gate, in order to increase the gate coupling ratio (GCR) of the flash memory.

To achieve these and other advantages and in accordance with the purpose of the invention, as embodied and broadly described herein, a manufacturing method of the present invention is provided. The method includes the following steps, first, sequentially forming a patterned first dielectric layer, a patterned first conductive layer and a patterned hard mask layer on a substrate. Then forming a conformal second conductive layer over the substrate, and etching back the second conductive layer by using the hard mask layer as a etching stop layer to form a conductive spacer on both side walls of the first conductive layer. Then removing the hard mask layer, and forming a second dielectric layer and a third conductive layer over the substrate. Thereafter, constructing a stacked gate structure constituting the third conductive layer, the second dielectric layer, the first conductive layer, the conductive spacer and the first dielectric layer. Next, a floating gate of the stacked gate structure is constructed by the remaining portions of the first conductive layer and the conductive spacer, and a source region and a drain region are formed in both sides of the stacked gate structure within the substrate.

In accordance with a further object of the present invention, a structure of a flash memory is provided. The structure includes a substrate; a tunnel oxide layer, a floating gate, a inter-poly dielectric, a control gate, a source region and a drain region. Herein the floating gate is formed on the substrate, and the floating gate includes a patterned conductive layer and a conductive spacer disposed on both side walls of the patterned conductive layer. The tunnel oxide layer is formed between the substrate and the floating gate, the control gate is formed on the floating gate, and the inter-poly dielectric is formed between the control gate and the floating gate. Finally, a stacked gate structure is constructed by the tunnel oxide layer, the floating gate, the inter-poly dielectric and the control gate, and then a source region and a drain region are formed in both side of the stacked gate structure within the substrate.

Accordingly, in the present invention, since a conductive spacer is disposed on the side walls of the conductive layer used as a floating gate, the corner contour of the conductive layer is rounded and the undercut of the side wall of the conductive layer is eliminated by the conductive spacer. Thus, the penetration of charge from the corner of the floating gate into the control gate is prevented, and therefore the data storage capacity is enhanced.

Moreover, since the floating gate of the present invention is constructed by the conductive layer and the conductive spacer disposed in the side walls of the conductive layer, the area between the floating gate and the control gate is expanded, thus the gate coupling ratio (GCR) of the stacked gate structure is enhanced.

Furthermore, in the process of forming the conductive spacer, since a hard mask layer is formed on the conductive layer provided as a floating gate desire, the hard mask layer can be used as an etching stop layer or protection layer during the etching back process. Thus the contour and the structure of the conductive layer under the hard mask layer can be completely protected, and then the contour and the structure of the floating gate can also be completely protected. Accordingly, the uniformity of the whole wafer can be controlled during the whole manufacturing process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The present invention provides a manufacturing method of a flash memory. FIG. 3A to FIG. 3E illustrate the schematic top views of the progressive manufacturing process steps of a flash memory according to a preferred embodiment of the present invention. FIG. 4A to FIG. 4E illustrate the schematic cross-sectional views of the manufacturing process steps of a flash memory according to a preferred embodiment of the present invention. FIG. 5A to FIG. 5E illustrate the schematic cross-sectional views of the manufacturing process steps of a flash memory according to a preferred embodiment of the present invention. Herein FIG. 4A to FIG. 4E are cross-sectional views taken along the line B–B" of FIG. 3A to FIG. 3E. FIG. 5A to FIG. 5E are cross-sectional views taken along the line C–C" of FIG. 3A to FIG. 3E, in which the cross sectional views in FIGS. 4A to 4E and in FIGS. 5A to 5E are mutually perpendicular.

Figure 1:
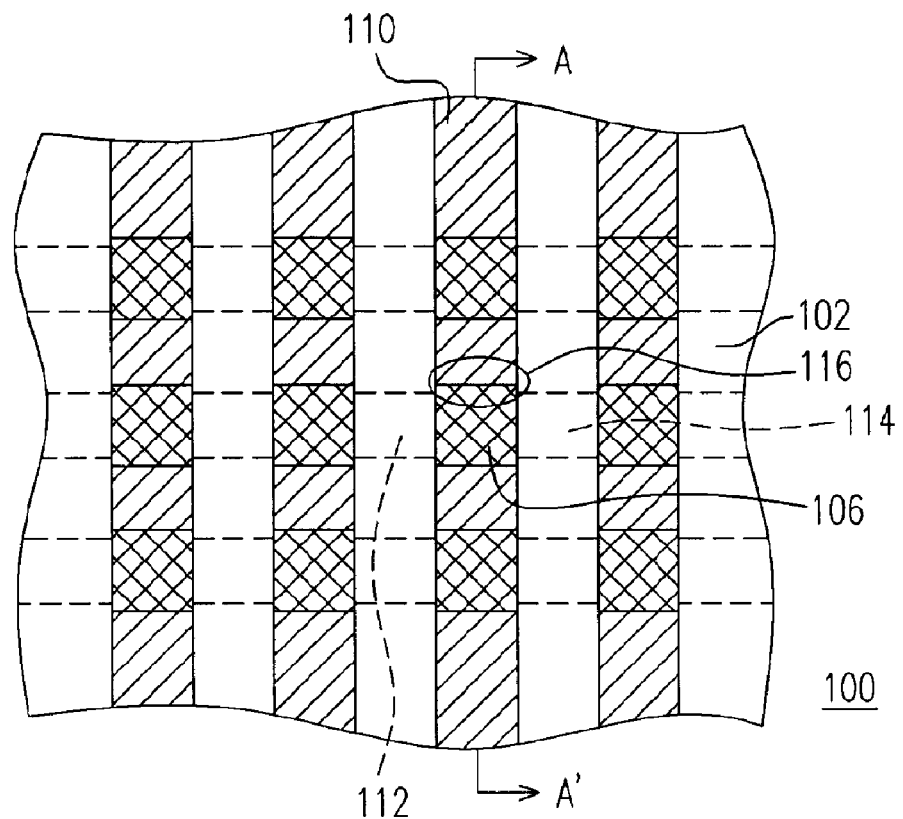
FIG. 1 is a top view illustrating a conventional flash memory.
Figure 2:
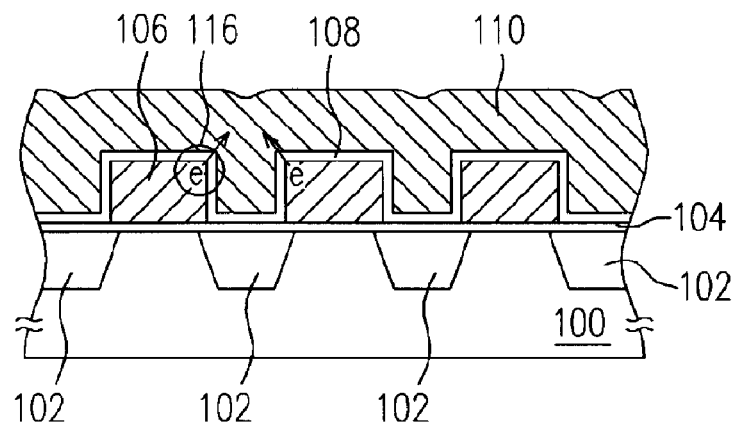
FIG. 2 is a cross-sectional view taken along the line A–A' of the flash memory of FIG. 1.
Figure 3A:
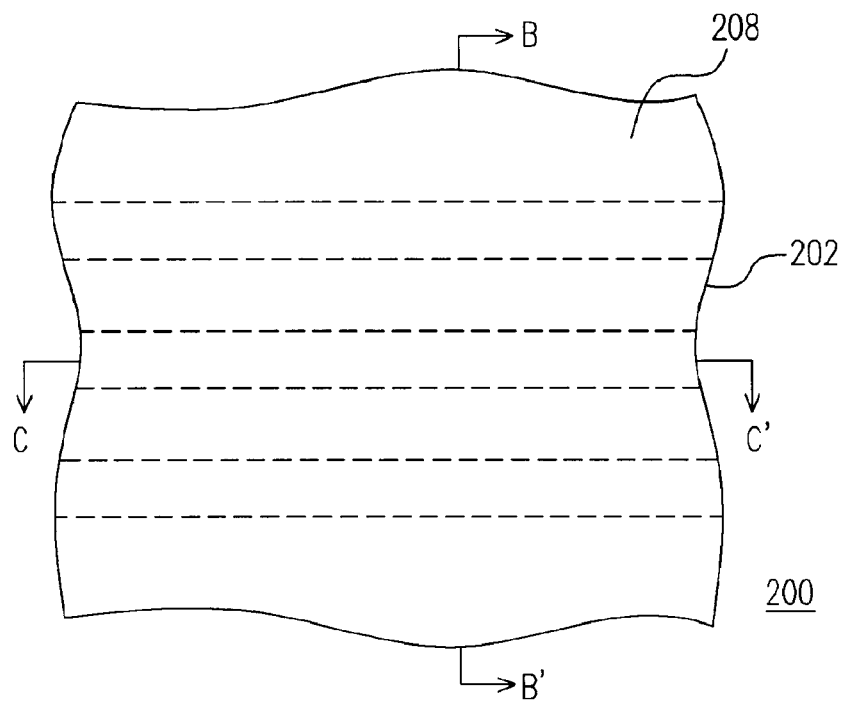
FIG. 3A to FIG. 3E schematically illustrate top views of a manufacturing process flow of a flash memory according to a preferred embodiment of the present invention.
Figure 4A:
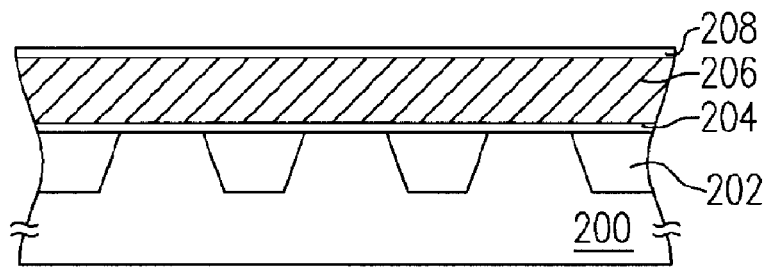
FIG. 4A to FIG. 4E schematically illustrate cross-sectional views of a manufacturing process flow of a flash memory taken along the line B–B" of FIG. 3A to FIG. 3E according to a preferred embodiment of the present invention.
Figure 5A:
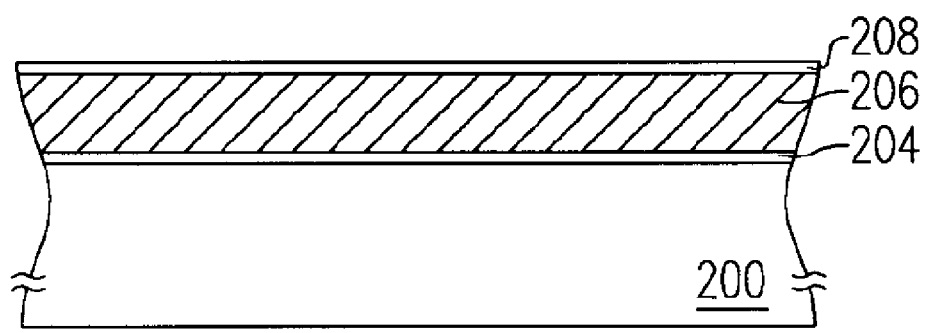
FIG. 5A to FIG. 5E schematically illustrate cross-sectional views of a manufacturing process flow of a flash memory taken along the line C–C" of FIG. 3A to FIG. 3E according to a preferred embodiment of the present invention, wherein the cross section in FIG. 4A to 4E and the cross section in FIGS. 5A to 5E are mutually perpendicular.

First, referring to FIG. 3A, FIG. 4A and FIG. 5A, a substrate 200 is provided, the substrate 200 includes, for example but not limited to, a semiconductor silicon substrate, and a shallow trench isolation (STI) layer 202 is formed in the substrate 200 previously. Then, a dielectric layer 204 is formed on the substrate 200. The material of the dielectric layer 204 includes, for example but not limited to, silicon oxide, and a method of forming the dielectric layer 204 includes, for example but not limited to, thermal oxidation method.

Then, a conductive layer 206 is formed on the substrate 200. The material of the conductive layer 206 includes, for example but not limited to, a doping polysilicon. A method of forming the conductive layer 206 includes, for example but not limited to, an in-situ ion implantation by using chemical vapor deposition (CVD) method. Then, a hard mask layer 208 is formed on the conductive layer 206. The material of the hard mask layer 208 includes, for example but not limited to, silicon nitride, silicon oxynitride, silicon oxide or spin on glass (SOG). A method of forming the hard mask layer 208 includes, for example but not limited to, chemical vapor deposition (CVD) or spin coating method, and a thickness of the hard mask layer 208 is for example in a range of about 0.1 nm to about 20 nm.

Figure 3B:
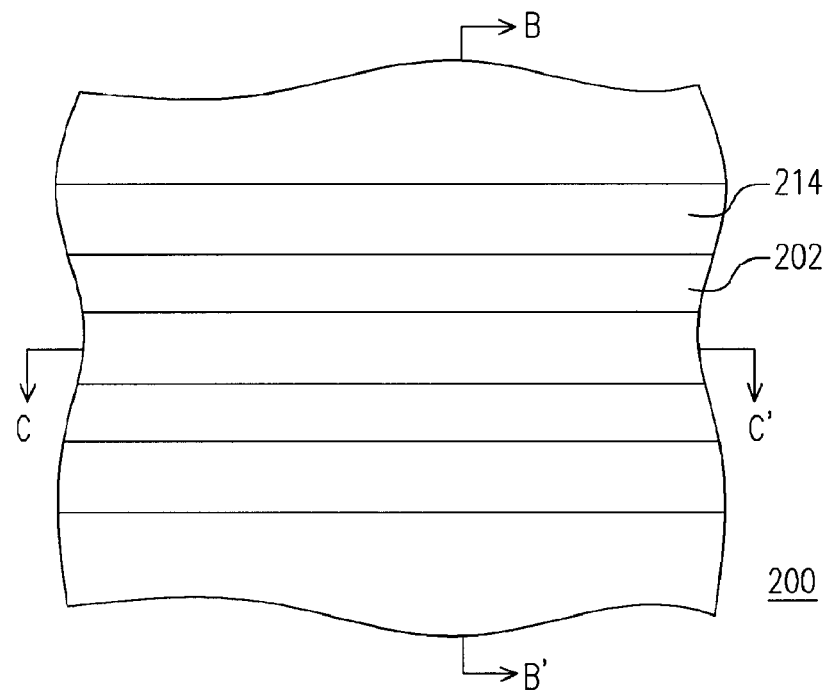
Figure 4B:
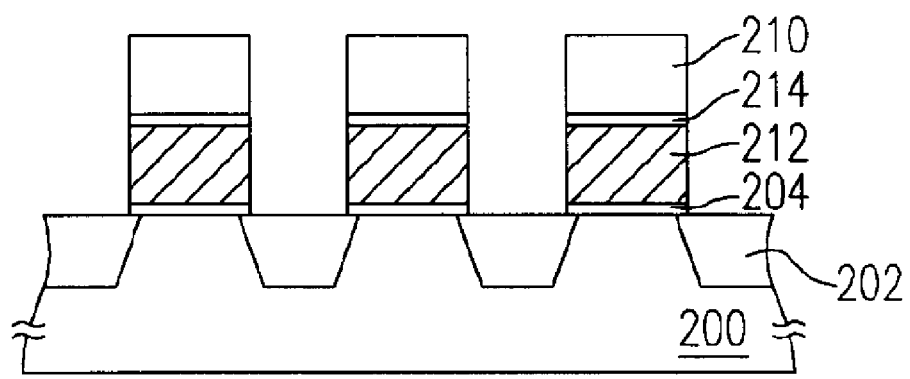
Figure 5B:
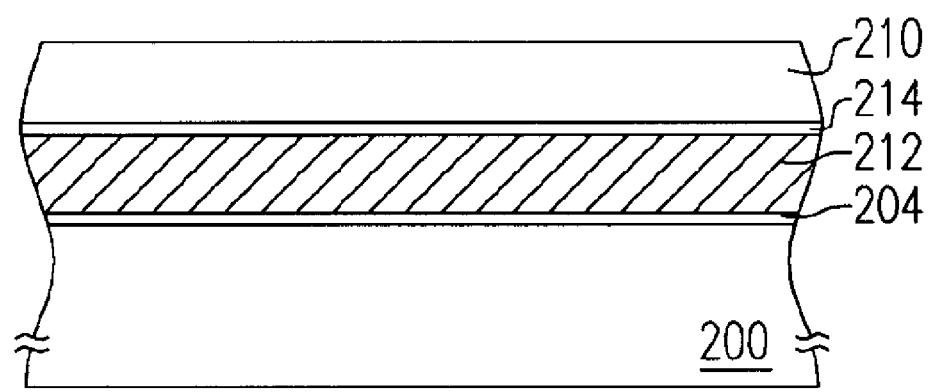

Referring to FIG. 3B, FIG. 4B and FIG. 5B, a patterned mask layer 210 is formed on the hard mask layer 208. The material of the mask layer 210 includes, for example but not limited to, a photoresist. Then, the conductive layer 206 and the hard mask layer 208 are patterned in order to form a plurality of linear conductive layers 212 and a plurality of linear hard mask layers 214 respectively. Methods of patterning the hard mask layer 208 and the conductive layer 206 include, for example but not limited to, removing the hard mask layer 208 and the conductive layer 206 using the patterned mask layer 210 as a mask. The method of removing the hard mask layer 208 and the conductive layer 206 include, for example but not limited to, an anisotropic etching method.

Figure 3C:
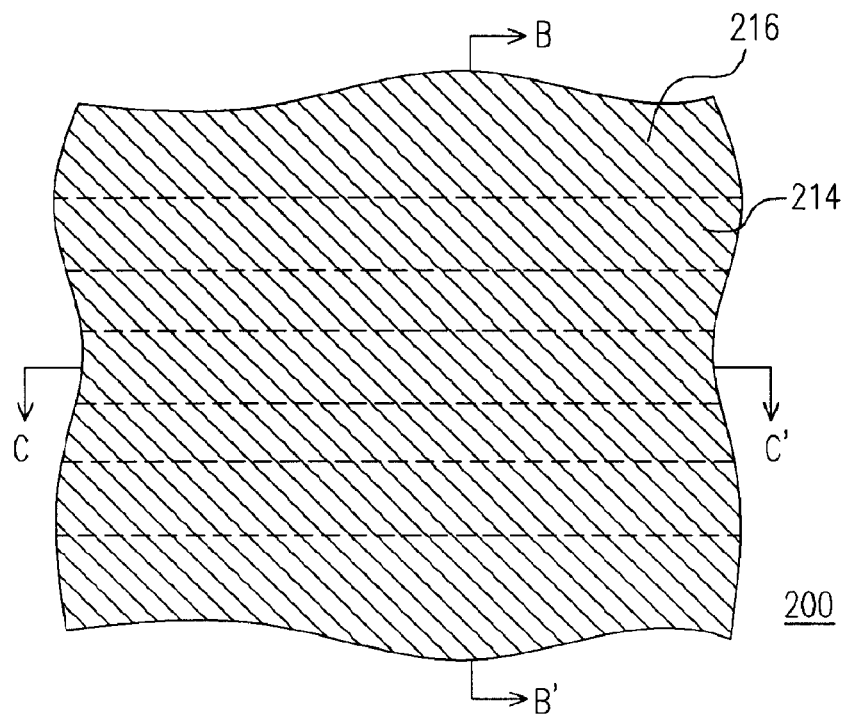
Figure 4C:
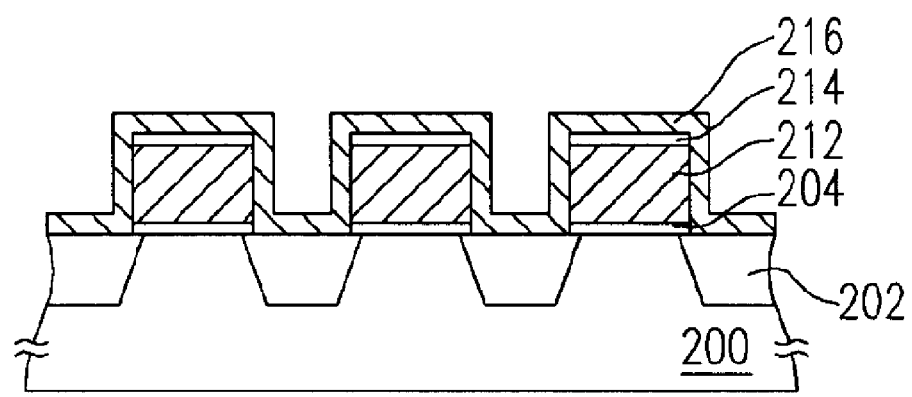
Figure 5C:
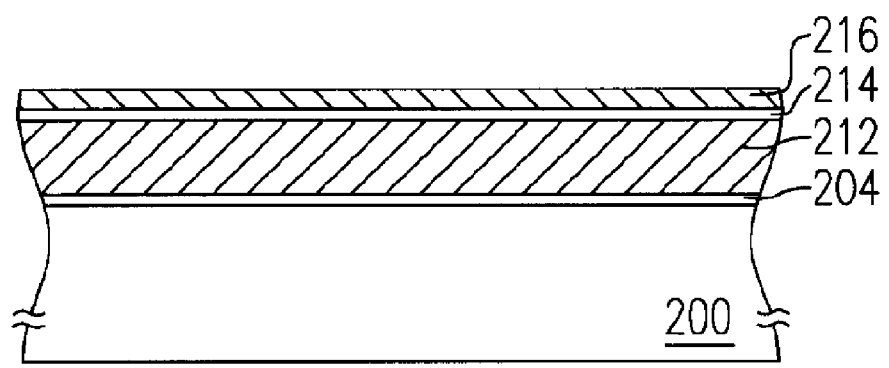

Referring to FIG. 3C, FIG. 4C and FIG. 5C, the mask layer 210 is removed, then a conformal conductive layer 216 is formed on the substrate 200. The material of the conformal conductive layer 216 includes, for example but not limited to, a doped polysilicon. The method of forming the conformal conductive layer 216 includes, for example but not limited to, in-situ ion implantation by using chemical vapor deposition (CVD), and a thickness of the conformal conductive layer 216 is for example in a range of 0.1 nm to about 100 nm.

Figure 3D:
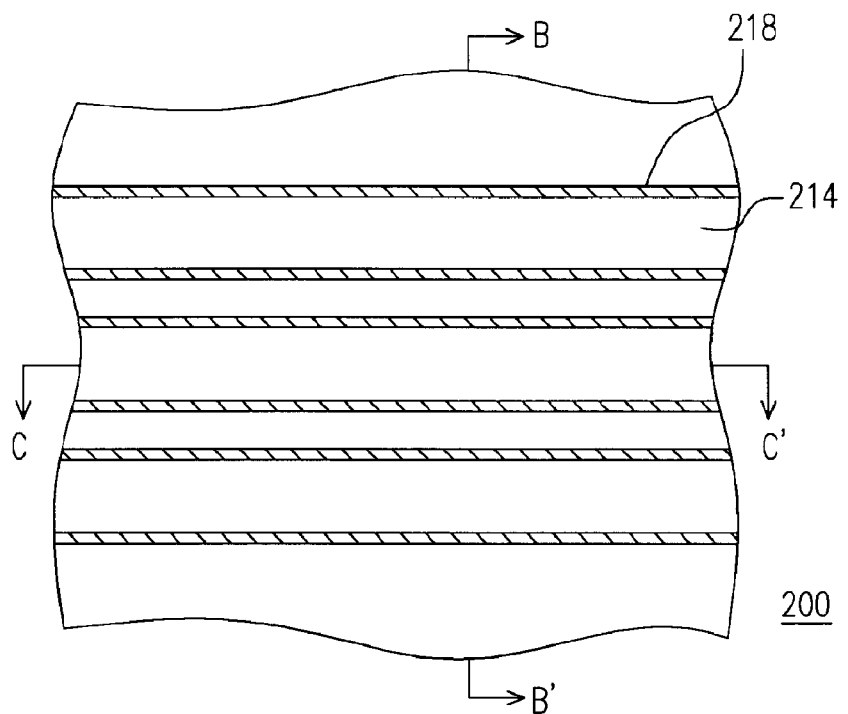
Figure 4D:
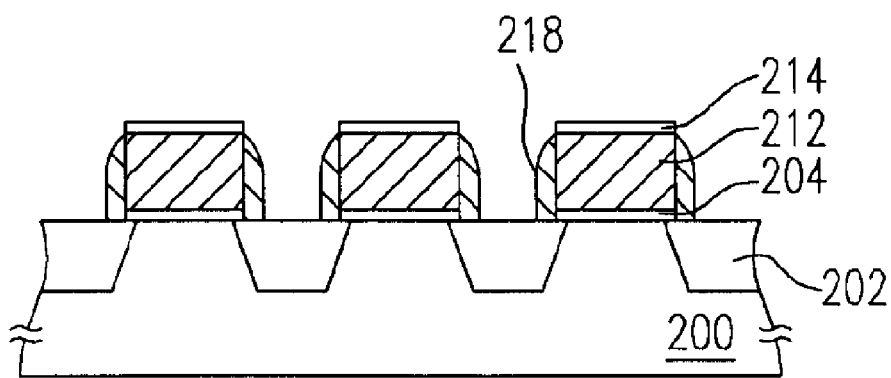
Figure 5D:
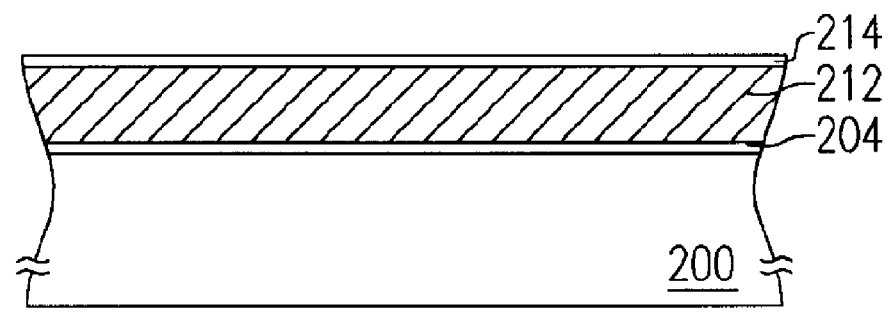

Referring to FIG. 3D, FIG. 4D and FIG. 5D, a portion of conformal conductive layer 216 is removed to form conductive spacer 218 on both of the side walls of the linear conductive layer 212. The method of removing a portion of the conformal conductive layer 216 includes, for example but not limited to, etching back the conformal conductive layer 216 using the hard mask layer 208 as an etching stop, until a surface of the hard mask layer 208 is exposed.

Since the hard mask layer 214 formed on the linear conductive layer 212 and can be used as an etching stop layer in the etching back process, for forming the conductive spacer 218 on both sidewalls of the linear conductive layer 212, and therefore the conductive layer 212 can maintain a complete contour and at the same time the structure can be protected by the hard mask layer 208 (etching stop layer).

Moreover, since the conductive spacer 218 is formed on the sidewalls of the linear conductive layer 212, the contour of the corners of the conductive layer 212 is blunted or rounded by the conductive spacer 218. Thus the data leakage problems due to the right-angled contour or the undercut of the sidewall as in the case of the conventional floating gate is eliminated. In addition, the contact area between the control gate and the conductive layer 212 combined with the conductive spacer 218 is larger than the contacting area between the control gate and the conductive layer 212, and therefore a higher charge coupling ratio can be effectively achieved.

Figure 3E:
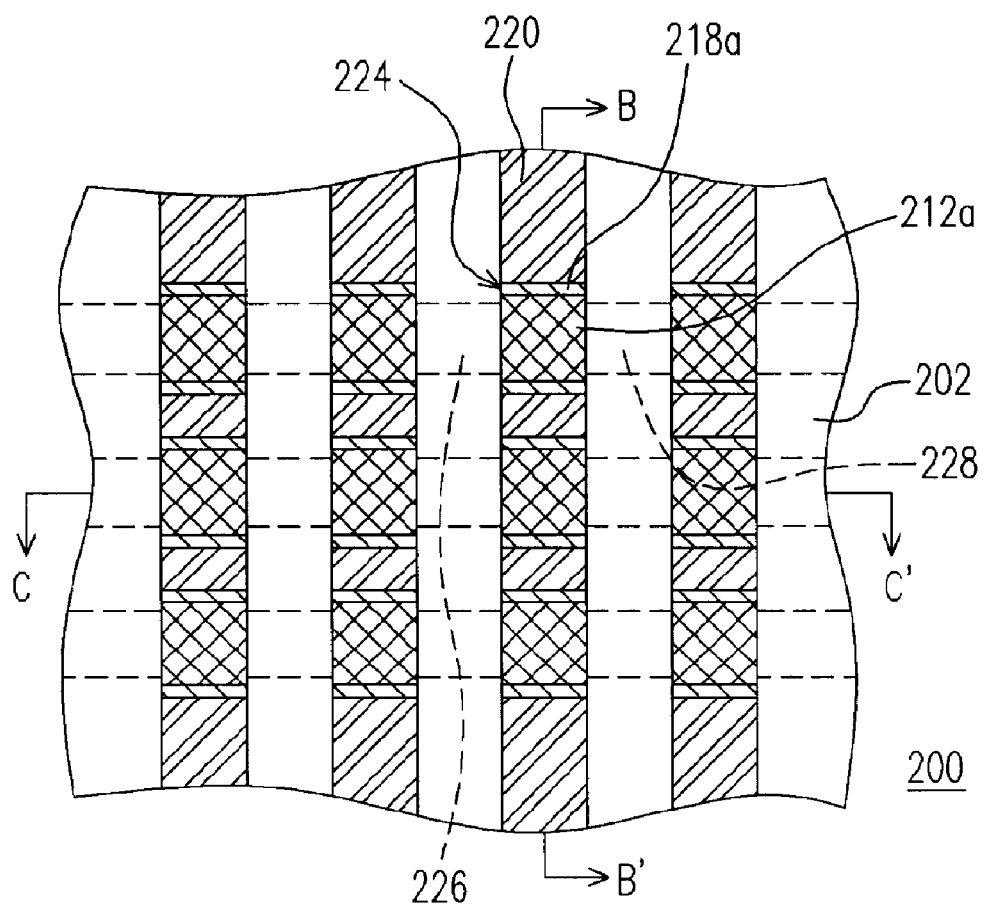
Figure 4E:
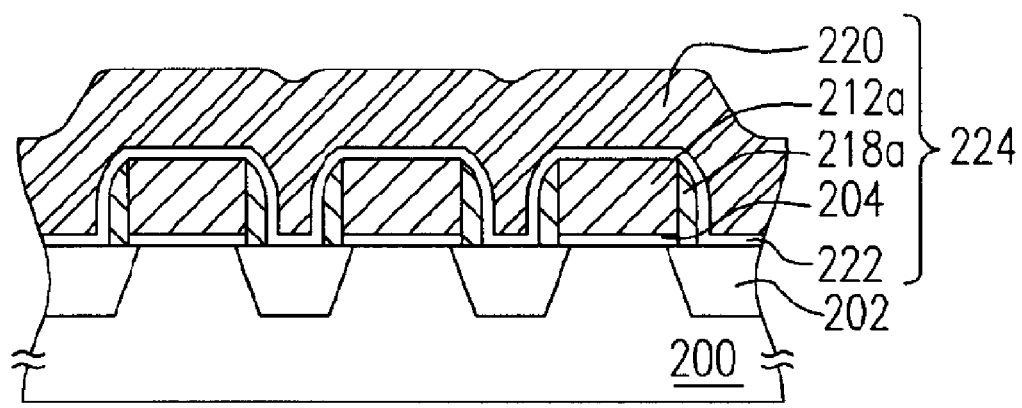
Figure 5E:
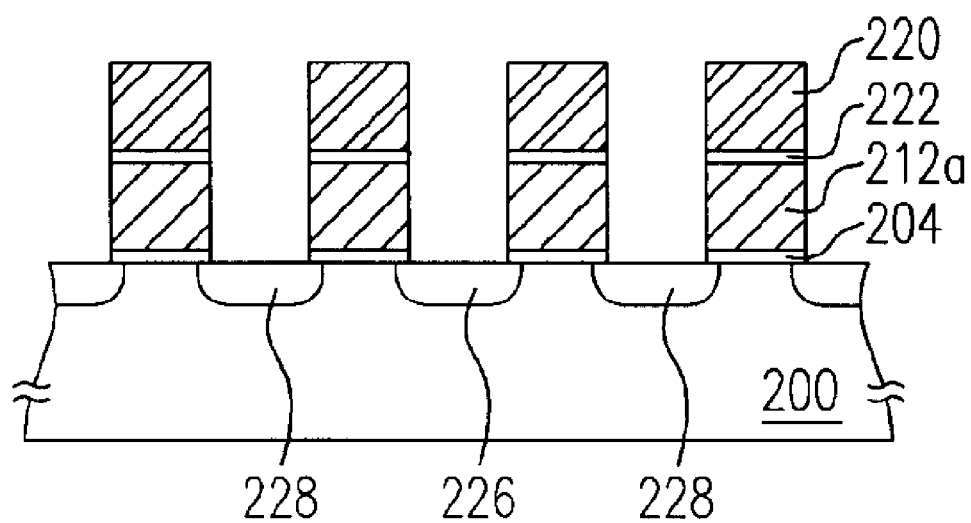

Referring to FIG. 3E, FIG. 4E and FIG. 5E, after the hard mask layer 208 is removed, a dielectric layer (not shown) and a conductive layer (not shown) are formed on the substrate 200, and then the conductive layer is patterned to construct a conductive layer 220 to serve as a control gate. Referring to FIG. 5E, during the process of patterning the conductive layer 220, the dielectric layer, the linear conductive layer 212 and the conductive spacer 218 are also patterned by the same mask to respectively form a patterned dielectric layer 222, a patterned conductive layer 212a and a patterned conductive spacer 218a. Herein the conductive layer 212a and the conductive spacer 218a is provided as a floating gate. Finally, a stacked gate structure 224 of the flash memory is constructed by the stacked structure of the conductive layer 220 (provided as a control gate), the dielectric layer 222 (an inter-poly dielectric), the conductive layer 212a and the conductive spacer 218a (provided as a floating gate), and the dielectric layer 204 (provided as a tunnel oxide layer). Subsequently, a source region 226 and a drain region 228 are formed within the substrate 200 to complete the manufacture of a flash memory.

The above description is directed to a manufacturing method of a flash memory of the present invention. Hereinafter, referring to FIG. 4E and FIG. 5E, a structure of a flash memory of a preferred embodiment of the present invention is described.

The flash memory of the present invention comprises a substrate 200, a dielectric layer 204, a conductive layer 212a, a conductive spacer 218a, a dielectric layer 222, a conductive layer 220, a source region 226 and a drain region 228. Wherein the conductive spacer 218a is disposed on both sidewalls of the conductive layer 212a, and a floating gate of the flash memory is constructed by the conductive spacer 218a and conductive layer 212a, and wherein the floating gate is disposed on the dielectric layer (tunnel oxide layer) 204 of the substrate 200.

The conductive layer 220 is provided as a control gate of the flash memory, in which the conductive layer 220 is disposed on the dielectric layer (inter-poly dielectric) 222 of the floating gate and the substrate. A stacked gate structure 224 of the flash memory is constructed by the dielectric layer 204, the floating gate (conductive spacer 218a and conductive layer 212a), the dielectric layer 222 and the conductive layer 220.

A source region 226 and a drain region 228 are respectively disposed in both sides of the stacked gate structure 224.

Accordingly, in the present invention, since a conductive spacer disposed on the sidewalls of the conductive layer is used as a portion of a floating gate, the right-angled contour of the corners of the conductive layer is rounded and the undercut of the sidewall of the conductive layer is eliminated by the conductive spacer formation. Thus, when operating the flash memory, even when an exceeded high voltage is applied to the control gate, a charge leakage from of the floating gate can be effectively eliminated, and thus the data storage capacity is enhanced.

Moreover, in the present invention, since the floating gate is constructed by the conductive layer and the conductive spacer disposed on the side walls of the conductive layer, and therefore the area between the floating gate and the control gate is enlarged, thus the gate coupling ratio (GCR) of the stacked gate structure is enhanced, and the electrical performance of the flash memory is also enhanced.

Furthermore, in the process of forming the conductive spacer, since a hard mask layer formed on the conductive layer can be used as an etching stop layer or protection layer during the etching back process, and therefore the contour and the structure of the conductive layer under the hard mask layer can be effectively protected, and also the contour and the structure of the floating gate can also be effectively protected. Accordingly, the uniformity of the whole wafer can be easily controlled during the whole manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of a flash memory, comprising:

a substrate;

a floating gate disposed on the substrate, wherein the floating gate comprises:

a patterned conductive layer disposed on the substrate; and a conductive spacer disposed on first both sidewalls of the patterned conductive layer, wherein a top surface of the conductive spacer and a top surface of the patterned conductive layer are located at the same level;

a tunnel oxide layer disposed between the substrate and the floating gate;

a control gate disposed on the floating gate;

an inter-poly dielectric disposed between the control gate and the floating gate, wherein a stacked gate structure is constructed by the tunnel oxide layer, the floating gate, the inter-poly dielectric and the control gate; and a source region and a drain region, disposed in both side of the stacked gate structure within the substrate.

2. The structure of a flash memory of claim 1, wherein a material of the conductive layer comprises a doped polysilicon.

3. The structure of a flash memory of claim 1, wherein a material of the conductive spacer comprises a doped polysilicon.

4. The structure of a flash memory of claim 1, wherein the source region and the drain region are disposed in the substrate adjacent second both sidewalls of the conductive layer without the conductive spacer.

* * * * *